(12) United States Patent
Cho

(10) Patent No.: US 8,753,445 B2
(45) Date of Patent: Jun. 17, 2014

(54) APPARATUS FOR GROWING HIGH QUALITY SILICON SINGLE CRYSTAL INGOT AND GROWING METHOD USING THE SAME

(75) Inventor: Hyon-Jong Cho, Gyeongsangbuk-do (KR)

(73) Assignee: Siltron, Inc., Gumi-si (KR)

( * ) Notice: Subject to any disclaimer, the term of this patent is extended or adjusted under 35 U.S.C. 154(b) by 1058 days.

(21) Appl. No.: 11/773,727

(22) Filed: Jul. 5, 2007

(65) Prior Publication Data

US 2008/0047485 A1 Feb. 28, 2008

Related U.S. Application Data

(62) Division of application No. 11/352,917, filed on Feb. 13, 2006, now Pat. No. 8,216,372.

(30) Foreign Application Priority Data

Sep. 21, 2005 (KR) ........................ 10-2005-0087754

(51) Int. Cl.
*C30B 15/14* (2006.01)
*C30B 15/00* (2006.01)

(52) U.S. Cl.
USPC ............... 117/20; 117/13; 117/15; 117/19; 117/917

(58) Field of Classification Search
USPC ................................ 117/13, 15, 19, 20, 917
See application file for complete search history.

(56) References Cited

U.S. PATENT DOCUMENTS

| | | | | |
|---|---|---|---|---|
| 5,471,949 A | * | 12/1995 | Kuramochi et al. | 117/208 |
| 5,911,825 A | | 6/1999 | Groat et al. | |
| 6,093,913 A | * | 7/2000 | Schrenker et al. | 219/424 |
| 6,527,859 B2 | * | 3/2003 | Lee et al. | 117/217 |
| 7,160,386 B2 | * | 1/2007 | Shiraishi et al. | 117/13 |
| 2003/0070605 A1 | | 4/2003 | Hoshi et al. | |
| 2004/0211359 A1 | * | 10/2004 | Shiraishi et al. | 117/208 |

FOREIGN PATENT DOCUMENTS

CN 1304460 A 7/2001

OTHER PUBLICATIONS

"The effects of argon gas flow rate and furnace pressure on oxygen concentration in Czochralski-grown silicon crystals", Machida, et al, Jounal or Crystal Growth 186 (1998) pp. 362-368.*

Chinese Patent Office Action for Chinese Patent Application 200610003165.X.

* cited by examiner

*Primary Examiner* — Matthew Song
(74) *Attorney, Agent, or Firm* — LRK Patent Law Firm

(57) ABSTRACT

The invention relates to an apparatus and method for growing a high quality Si single crystal ingot and a Si single crystal ingot and wafer produced thereby. The growth apparatus controls the oxygen concentration of the Si single crystal ingot to various values thereby producing the Si single crystal ingot with high productivity and extremely controlled growth defects.

5 Claims, 4 Drawing Sheets

APPARATUS FOR GROWING HIGH QUALITY SILICON SINGLE CRYSTAL INGOT AND GROWING METHOD USING THE SAME

CROSS-REFERENCE TO RELATED APPLICATIONS

The present application is a divisional of U.S. patent application Ser. No. 11/352,917, now U.S. Pat. No. 8,216,372, filed Feb. 13, 2006, the teachings of which are hereby incorporated by reference.

BACKGROUND OF THE INVENTION

1. Field of the Invention

The present invention relates to a high quality silicon single crystal ingot which is free of point defect, and more particularly, a high quality silicon single crystal ingot and wafer of controlled growth defects having various oxygen concentrations desirable to customers, which are enabled by controlling oxygen concentrations to desirable values when the silicon single crystal ingot is grown by the Czochralski method, and a method and apparatus for growing the same.

2. Description of the Prior Art

As well known in the art, in order to grow a high quality silicon (Si) single crystal ingot that can enhance the yield of semiconductor devices, temperature control has mainly been conducted on high temperature distribution of the single crystal ingot after crystallization. This is done in order to control contraction-induced stress and so on, resulting from cooling subsequent to crystallization or behavior of point defects built up in solidification.

Also, in order to meet various oxygen specifications (suitable for semiconductor devices) demanded by customers, additional capital has been invested. For example, process parameters such as pressure and argon (Ar) flow rate are adjusted, hot zones are changed, and horizontal strong magnetic field is introduced.

According to a typical process of the Czochralski growth of Si single crystal, polycrystalline Si is loaded into a quartz crucible where it is melted into Si melt under the heat radiated from a heater, and then a Si single crystal ingot is grown from the surface of Si melt.

When growing the Si single crystal ingot, the crucible is elevated through the rotation of a shaft that supports the crucible, maintaining the solid-liquid interface at a constant level, and the Si single crystal ingot is wound up while being rotated coaxially with the crucible, but with an opposite rotating direction. Upon being grown as above, the Si single crystal ingot is produced into Si single crystal wafers (via wafer-processing such as slicing, lapping, polishing and cleaning), which are in turn used as semiconductor device substrates.

Conventional techniques for growing a Si single crystal ingot as above have used a heat shield in order to regulate the temperature gradient of a growing Si single crystal and oxygen evaporation from Si melt. Examples of such conventional techniques may include Korean Patent No. 374703, Korean Patent Application No. 2000-0071000 and U.S. Pat. No. 6,527,859 and so on. As, according to a report by Machita et al., "*The effects of argon gas flow rate and furnace pressure on oxygen concentration in Czochralski-grown Si crystals*" (Journal of Crystal Growth, 186 (1998) 362-368), and Korean Patent Application No. 2001-7011548, installation of a hot zone such as a gas flow controller as well as adjustment of pressure, Ar flow rate and rotation speed of a crucible are proposed as means for controlling oxygen concentration. Furthermore, Japanese Laid-Open Patent Application Nos. 2000-247788 and H10-130100 disclose restraining oxygen dissolution and melt convection by using an apparatus for adjusting magnetic field strength and a unit for generating a multi-CUSP magnetic field.

However, adjustment of several process parameters of the prior art cannot efficiently control the temperature gradient or oxygen concentration of a Si single crystal ingot. So, it has been impossible to produce a high quality Si single crystal ingot and wafer with low point defect concentration that have oxygen concentrations desirable to customers.

Conditions for preferable wafer substrates suitable for device process are as follows: In an active device region formed from a wafer surface to several microlayers in depth, it is preferable to eliminate all agglomerated defects, such as vacancy and self-interstitial, except for point defects. For example, the Crystal Originated Pit (COP), as a type of point defect with agglomerated vacancies worsens the Gate Oxide Integrity (GOI), thereby dropping device yield. Furthermore, GOI may worsen if micro precipitates depending on oxygen and vacancy concentration have occurred in the active device region. On the other hand, Bulk Micro Defect (BMD) containing micro precipitates is needed in a bulk region deeper than the active device region. The MBD occurring during heat treatment of a semiconductor device is harmful for the active device area, but improves device yield by gettering of metal impurities existing in the wafer surface and the active device region. Therefore, a preferable wafer substrate needs suitable vacancy and oxygen concentration.

Meanwhile, as described in Korean Patent Application Nos. 1999-7009261, 1999-7009307 and 1999-7009309, the prior art expresses vertical temperature gradient of crystal in the form of $G_0=c+ax^2$. So, vacancy concentration increases gradually to the center from the outer circumference of a single crystal ingot but interstitial concentration decreases. If out-diffusion does not take place by a sufficient degree around the outer circumference of the single crystal ingot, interstitial crystal defect such as LDP occurs. This causes crystal growth to be carried out with high vacancy concentration in the center. Therefore, vacancy crystal defect (e.g., void, Oxidation induced Stacking Fault (OiSF)) tends to occur in the center of a wafer owing to vacancy concentration much higher than balance concentration. On the other hand, dropping the cooling rate of crystal for the purpose of interstitial out-diffusion further requires installation of additional hot zones. This decreases the growth rate of the single crystal ingot, thereby lowering productivity.

As approaches for controlling the temperature distribution of a Si single crystal ingot in order to produce a high quality Si single crystal ingot, following conventional technologies have been proposed. Japanese Patent Application No. H02-119891 proposes to control temperature distribution in the center and circumference of a Si single crystal ingot by adopting hot zones during cooling of the ingot in order to reduce crystal defects in the ingot owing to the strain of solidification. This document particularly discloses using a cooling sleeve to increase solidification rate in the growth direction of the single crystal ingot and thus decreasing lattice defect. Furthermore, Japanese Patent Application No. H07-158458 proposes to control the temperature distribution and pulling rate of a single crystal ingot. Japanese Patent Application No. H07-066074 proposes to improve a hot zone and control cooling rate in order to restrain crystal defect formation by using point defect diffusion. Korean Patent Application No. 2002-0021524 claims that the productivity of a high quality single crystal ingot was enabled by improving a heat shield and a water cooling pipe. Japanese Patent Application H05-

061924 proposes to impart periodic variation to the growth rate of a Si single crystal ingot in order to prevent a crystal defect in the single crystal ingot by using the hysteresis of a region where a crystal defect such as OSF and oxygen precipitation defect takes place.

However, the afore-mentioned conventional techniques are based upon solidification or solid state reaction and thus have following problems: First, there are many obstacles against high quality Si single crystal. For example, Korean Patent Application 1999-7009309 (U.S. Patent Application No. 60/041,845) is aimed to reduce point defect concentration by sufficiently diffusing supersaturated point defect in a hot region before it grows into crystal defect. However, temperature has to be maintained up to 16 hours or more for this purpose, and thus this technique can be realized only theoretically but not in actual use.

Second, most conventional techniques fail to make practical achievement. When a 200 mm Si single crystal ingot was grown by periodically varying the pulling speed of a crystal ingot as proposed by Japanese Patent Application H05-61924 and Eidenzon et al. (Defect-free Silicon Crystals Grown by the Czochralski Technique, Inorganic Materials, Vol. 33, No. 3, 1997, pp. 272-279), the high quality target was not achieved, and the process became unstable to the contrary.

Third, those techniques based upon solidification cannot achieve high productivity. Even though a heat shield and a water-cooling pipe were designed in optimal conditions according to the Korean Patent Application No. 2001-7006403, this arrangement merely showed low productivity since pulling speed for high quality single crystal was actually about 0.4 mm/min.

Other approaches for controlling oxygen concentration in a Si single crystal ingot include Japanese Patent Application H10-013010, Korean Patent Registration No. 10-0239864 and Korean Patent Registration No. 2001-7011548. However, these techniques have drawbacks in that either they require additional investment or the high quality single crystal is not actually produced.

Moreover, according to the afore-mentioned techniques, the sought-after high quality single crystal can be produced only with low yield.

SUMMARY OF THE INVENTION

Accordingly, the present invention has been made to solve the above-mentioned problems occurring in the prior art, and an object of the present invention is to provide an apparatus for growing a Si single crystal ingot with extremely controlled growth defects by controlling its oxygen concentration to various values, thereby producing the Si single crystal ingot with high productivity.

Another object of the invention is to provide an apparatus and method for growing a high quality Si single crystal ingot in which a heater is used to generate localized heat, thereby independently controlling oxygen dissolution and heat flow.

Further another object of the invention is to provide a high quality Si single crystal ingot and wafer with variously controlled oxygen concentrations desirable to customers.

Anther object of the invention is to provide a high quality Si single crystal ingot with variously controlled oxygen concentration.

Further another object of the invention is to provide a high quality Si single crystal ingot with high productivity.

Yet another object of the invention is to provide a high quality Si single crystal ingot with high yield.

In order to accomplish this object, the invention provides an apparatus for growing silicon single crystal by the Czochralski method, comprising: a chamber; a crucible provided inside the chamber, and containing silicon melt; a heater provided at a side of the crucible to heat silicon melt, and having a maximum heat output part in a predetermined position inside the crucible; and a pulling mechanism for pulling a growing silicon single crystal ingot from silicon melt.

Preferably, the maximum heat output part of the heater is formed in a region corresponding to 30 mm to 120 mm points of silicon melt from the head thereof.

Preferably, the maximum heat output part of the heater is formed in a region corresponding to 120 mm to 300 mm points of silicon melt from the head thereof.

Preferably, the maximum heat output part of the heater covers 10 to 25% of the total length of the heater.

The growing apparatus may further comprise a magnet provided at a side of the crucible to induce a magnetic field to silicon melt.

Preferably, the magnet is adapted to induce a magnetic field that promotes melt convection from a portion of silicon melt which is most adjacent to the heater to the center of the single crystal.

Preferably, the magnet is adapted to induce asymmetric CUSP magnetic field.

The growing apparatus may further comprise a heat shield provided between the silicon single crystal ingot and the crucible, the heat shield surrounding the silicon single crystal ingot to shield heat radiated from the ingot.

The growing apparatus may a cylindrical heat shelter attached to a portion of the heat shield, which is most adjacent to the silicon single crystal, the heat shelter surrounding the silicon single crystal.

The invention also provides a method for growing silicon single crystal by the Czochralski method, the method controlling the quantity of oxygen dissolution out of a crucible containing silicon melt.

Preferably, the quantity of dissolved oxygen is controlled by adjusting a heater so that the heater has a maximum heat output in a predetermined position within the crucible.

Preferably, the quantity of dissolved oxygen is controlled so that oxygen concentration within a silicon single crystal ingot is 8 ppma to 11.5 ppma.

Preferably, the quantity of dissolved oxygen is controlled so that oxygen concentration within a silicon single crystal ingot is 11.5 ppma to 15 ppma.

Preferably, the temperature of silicon melt rises gradually in proportion to the distance from a single crystal ingot up to a hottest point and descends gradually from the hottest point when measured along an axis in parallel with a longitudinal direction of the single crystal ingot starting from an interface between silicon melt and the single crystal ingot, and wherein the heater is adapted to minimize oxygen dissolution from the crucible and promote melt convection from a portion of silicon melt which is most adjacent to the heater toward a center of the interface or a hot region surrounding the hottest point.

Preferably, the silicon single crystal ingot is grown with substantially asymmetric quality distribution about a central axis by the promoted melt convection.

The invention also provides a method for machining a silicon single crystal ingot grown according to the above-described method into high quality silicon wafers.

Preferably, the silicon wafer produced from a silicon single crystal ingot grown by the Czochralski method of the invention has an interstitial oxygen concentration of 8 ppma to 11.5 ppma.

Preferably, the wafer has an interstitial oxygen concentration of 11.5 ppma to 15 ppma.

Preferably, the silicon ingot grown by the Czochralski method of the invention has an interstitial oxygen concentration of 8 ppma to 11.5 ppma.

Preferably, the ingot has an interstitial oxygen concentration of 11.5 ppma to 15 ppma.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

The following detailed description will present an apparatus and process for growing a high quality Si single crystal ingot according to the invention with reference to the accompanying drawings.

Figure 1:
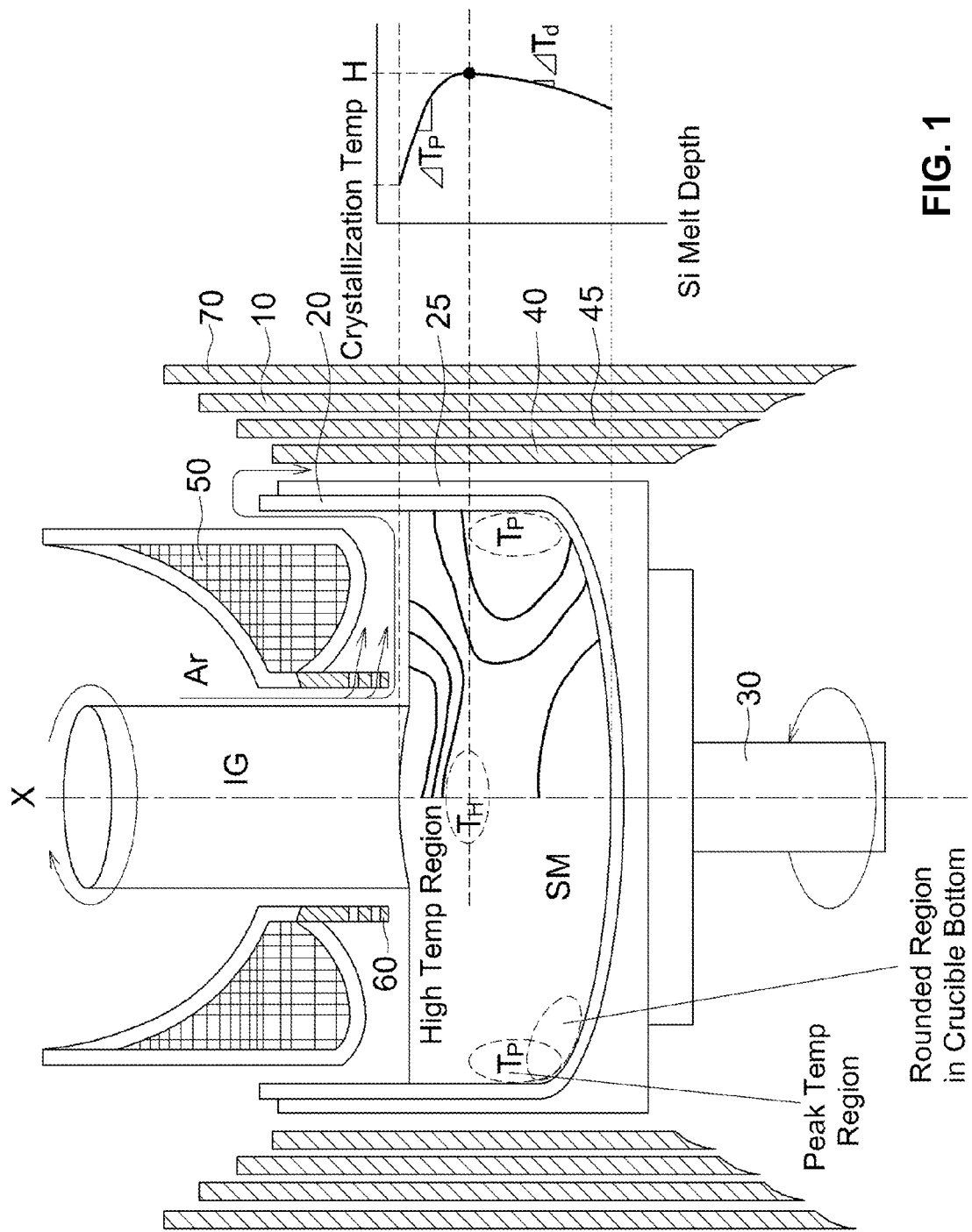
FIG. 1 is a schematic view illustrating a process for growing a Si single crystal by the Czochralski method according to an embodiment of the invention, where the temperature profile of Si melt is measured along an axis in parallel to the radial direction of a single crystal ingot.
Figure 2:
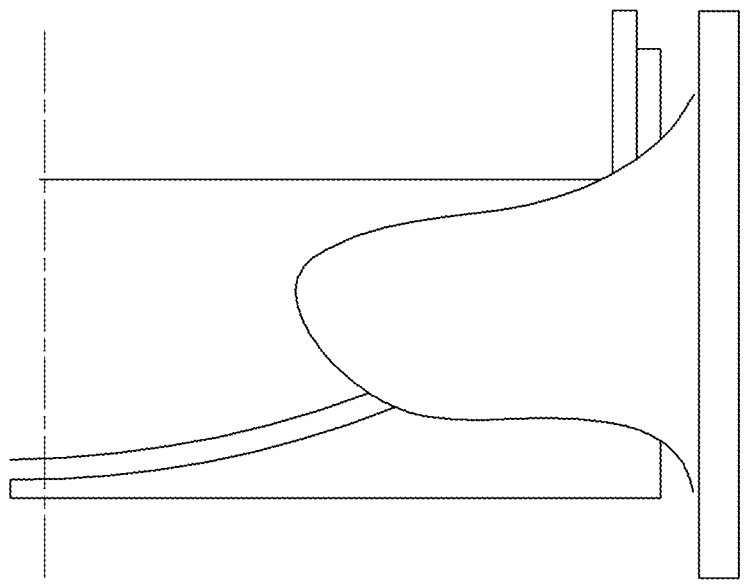
FIG. 2 is a schematic cross-sectional view illustrating a crucible and a heater of a conventional apparatus for growing a Si single crystal ingot, where heat distribution is plotted.
Figure 3:
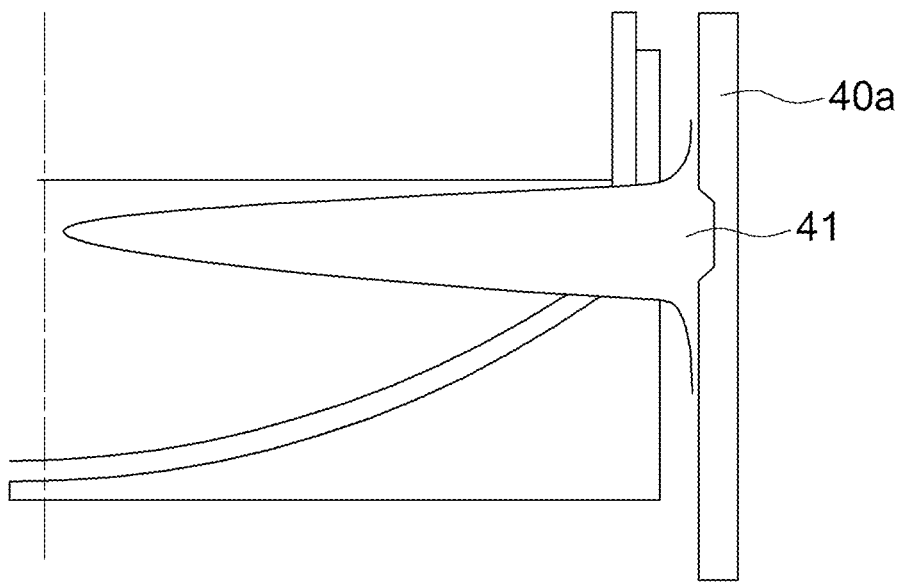
FIG. 3 is a schematic cross-sectional view illustrating a crucible and a heater of an apparatus for growing a Si single crystal ingot according to an embodiment of the invention, where heat distribution is plotted.
Figure 4:
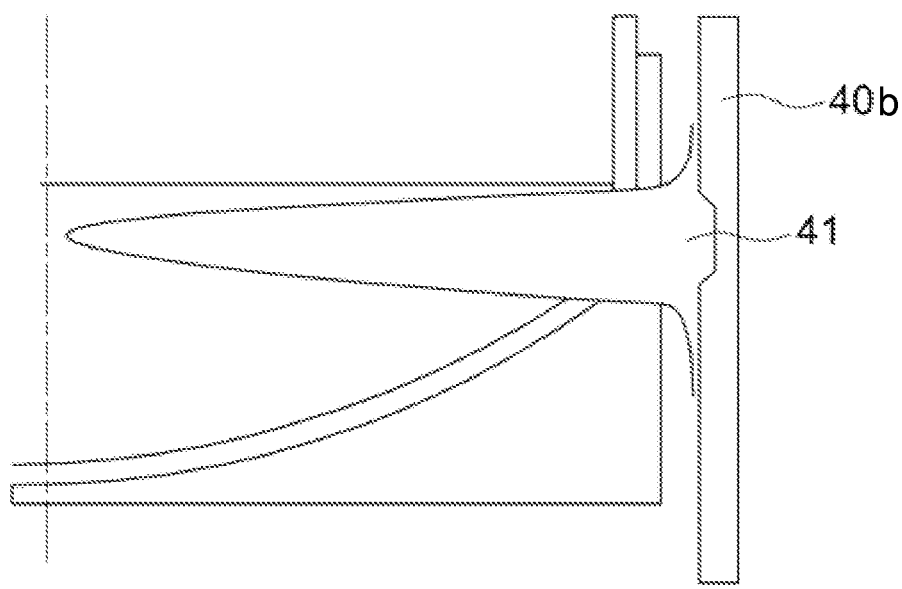
FIG. 4 is a schematic cross-sectional view illustrating a crucible and a heater of an apparatus for growing a Si single crystal ingot according to another embodiment of the invention, where heat distribution is plotted.
Figure 5:
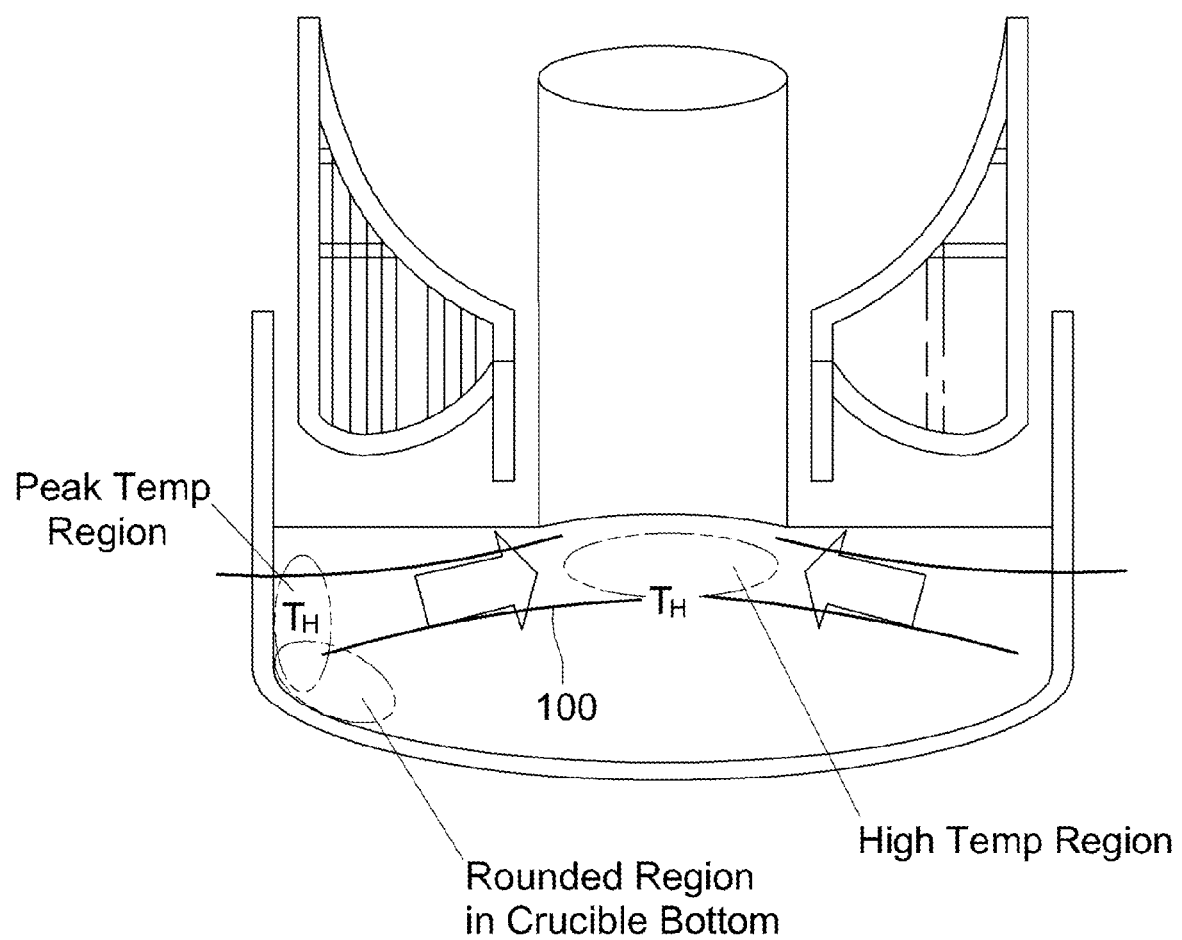
FIG. 5 is a schematic cross-sectional view illustrating growth of a Si single crystal ingot by using a heater as shown in FIG. 3 according to the invention, in which a suitable heat transfer channel is formed from a peak temperature region to a hot region.

FIG. 1 is a schematic view illustrating a process for growing a Si single crystal by the Czochralski method according to an embodiment of the invention, where the temperature profile of Si melt is measured along an axis in parallel to the radial direction of a single crystal ingot, FIG. 2 is a schematic cross-sectional view illustrating a crucible and a heater of a conventional apparatus for growing a Si single crystal ingot, where heat distribution is plotted, FIG. 3 is a schematic cross-sectional view illustrating a crucible and a heater of an apparatus for growing a Si single crystal ingot according to an embodiment of the invention, where heat distribution is plotted, FIG. 4 is a schematic cross-sectional view illustrating a crucible and a heater of an apparatus for growing a Si single crystal ingot according to another embodiment of the invention, where heat distribution is plotted, and FIG. 5 is a schematic cross-sectional view illustrating growth of a Si single crystal ingot by using a heater as shown in FIG. 3 according to the invention, in which a suitable heat transfer channel is formed from a peak temperature region to a hot region.

The present invention starts from the concept that in growth of a solid Si single crystal from Si melt, a high quality Si single crystal ingot of minimized point defect cannot be grown sufficiently by merely adjusting single crystal temperature gradient and solid-liquid interface profile, but there may exist more decisive factors for the growth of the high quality Si single crystal ingot.

In order to overcome restrictions in solid state reaction subsequent to crystallization, the liquid state before solidification has been analyzed thoroughly, and as a result, it was found that the temperature distribution of Si melt is critical.

Crystal growth is generally carried out as growth units such as atoms or molecules migrate and adhere to a crystal growth interface or metastable region, in which rising temperature gradient in Si melt enhances driving force of the liquid state growth units to migrate toward the crystal growth interface or metastable region.

Herein the crystal growth interface is also referred to as crystallization interface or solid-liquid interface where a solid Si single crystal ingot contacts liquid Si melt. The metastable region means a status of liquid Si melt ready for solidification, which has incomplete crystallinity.

Since high temperature gradient in Si melt drives more growth units to participate in crystal growth, low pulling rate causes excessive atoms to crystallize, thereby imparting self-interstitial dominant characteristics to a Si single crystal ingot. On the contrary, low temperature gradient in Si melt fails to provide a sufficient number of atoms tending to crystallize so that high pulling rate imparts vacancy dominant characteristics to the Si single crystal ingot.

FIG. 1 is a schematic view illustrating a process of Si single crystal growth by the Czochralski method according to an embodiment of the invention. As shown in FIG. 1, an apparatus for growing a Si single crystal ingot according to the invention includes a chamber 10 where the Si single crystal ingot is grown.

A quartz crucible 20 containing Si melt (indicated with SM) is installed inside the chamber 10, and a crucible support 25 made of graphite is installed surrounding the quartz crucible 20.

The crucible support 25 is fixed to a rotary shaft 30, which is rotated by drive means (not shown) to turn and elevate the quartz crucible 20, thereby maintaining a solid-liquid interface to a predetermined level. The crucible support 25 is surrounded by a cylindrical heater 40 with a predetermined gap, and the heater 40 is surrounded by a barrel-shaped thermostat or heat insulator 45 made of heat insulator in order to prevent heat radiated from the heater 40 from dispersing toward the wall of the chamber 10, thereby enhancing heat efficiency.

The heater 40 is installed aside the quartz crucible 20, and basically serves to heat high purity polycrystal Si lump loaded in the quartz crucible 20 into Si melt SM (see FIGS. 1 and 2).

The heater 40 of the invention also functions to control oxygen dissolution from the quartz crucible, and a schematic cross-section of the heater 40 and a heat distribution profile thereof are shown in FIGS. 3 and 4. That is, the heater 40 of the invention is not a conventional long heater or short heater of the prior art that simply melts polycrystal Si lump (see FIG. 2), but one that can enable localized heating by increasing resistance in a specific region while maintaining overall heating so that the specific region is intensively heated.

As illustrated in FIGS. 3 and 4, heaters 40a and 40b of the invention have a trapezoidal groove 41 by narrowing cross section in a specific region. Then, resistance in the narrowed region increases making this region as a maximum heat output part 41. By adjusting the location the localized heating, it is possible to control oxygen dissolution out of the quartz crucible and temperature distribution within Si melt. Of course, the groove 41 is not limited to the trapezoidal shape, but can have any shape that can reduce cross section.

While graphite has been illustrated as the heating material of the heater 40, the invention is not limited thereto. Rather, silicone can be also used to generate maximum heat from the localized hottest point region.

Furthermore, by changing the localized heating position of the heater 40, it is possible to control oxygen dissolution out of the quartz crucible and the migration of dissolved oxygen, thereby growing high quality Si single crystal ingots with various oxygen concentrations.

If the maximum heat output part 41 of the heater 40 is formed in a region corresponding to 30 mm to 300 mm points from the head of Si melt with respect to the total depth thereof, the oxygen concentration of a high quality Si single crystal ingot can be controlled in the level of 8 ppma to 15 ppma.

In case of growing a high quality Si single crystal ingot with low oxygen concentration, the maximum heat output part 41 of the heater 40a is preferably formed in a region corresponding to 30 mm to 120 mm points from the head of Si melt, thereby controlling the oxygen concentration of the high quality Si single crystal ingot to be in the range of 8 to 11.5 ppma.

On the other hand, in case of growing a high quality Si single crystal with high oxygen concentration, the maximum heat output part 41 of the heater 40b is preferably formed in a region corresponding to 120 mm to 300 mm points from the head of Si melt in order to control the oxygen concentration of the high quality silicon single crystal ingot.

In this case, the maximum heat output part 41 of the heater 40 covers preferably 5% to 40%, and more preferably 10% to 25% of the entire length of the heater 40.

That is, the heater 40 of the invention promotes melt convection along an imaginary channel 100 from a hottest region to a hot region of Si melt in order to realize heat transfer with minimized heat loss "channel effect."

Then, a hot portion of Si melt can migrate from the localized hottest region to the hot region or an upper region thereof along the shortest path with minimized heat loss. This increases temperature difference between the hot region and the solid-liquid interface, thereby accelerating crystal growth rate proportionally.

Table 1 below shows the oxygen concentration and high quality growth rate of Examples 1 to 3 and Comparative Examples 1 and 2, found by changing heater type and the ratio and position of the hottest region.

TABLE 1

| | Heater type | Ratio of MHO* (%) | Position of MHO* | Oxygen concentration of GSI* | Ratio of HQG* (V/Vo) |
|---|---|---|---|---|---|
| Example 1 | Local heater | 30 | 150 mm from melt head | 11.1 ppma | 1.06 |
| Example 2 | Local heater | 18 | 80 mm from melt head | 9.5 ppma | 1.1 |
| Example 3 | Local heater | 18 | 210 mm from melt head | 13.2 ppma | 1.1 |
| Comp. Exam. 1 | Short heater | — | — | 11.2 ppma | 1 |
| Comp. Exam. 2 | Long heater | — | — | 12.5 ppma | 1 |

MHO*: Maximum heat output portion of heater
GSI*: Grown single silicon crystal ingot
HQG*: High quality growth rate Such a channel effect can increase the temperature gradient of Si melt from the solid-liquid interface to the hot region or the rising temperature gradient of Si melt but relatively drop the temperature of the crucible bottom, thereby restricting oxygen dissolution at a rounded portion of the crucible bottom.

This phenomenon results from the fact that the driving force causing the growth units, such as atoms and molecules, to migrate toward a crystal growth interface is increased in proportion to the temperature gradient of Si melt rising from the solid-liquid interface to the peak or hottest point. This as a result can raise the pulling rate or growth rate of a high quality Si crystal ingot to such a degree that minimizes point defects such as vacancy and interstitial.

This will be described in detail with reference to FIG. 1, which illustrates isotherm lines within Si melt SM together with the temperature gradient profile of Si melt measured along an imaginary axis in parallel with the radial direction of a single crystal ingot.

Examining the temperature of Si melt SM, peak temperature is found in a portion of Si melt SM (designated with $T_P$ region in FIG. 1) placed in a side portion of the crucible 20 most adjacent to the heat source or heater 40, and minimum temperature is found as solidification temperature in a solid-liquid interface where crystal growth takes place.

In measurement of the temperature gradient of Si melt SM along an axis in parallel with the radial direction of a single crystal ingot IG, the temperature gradient becomes a vertical instantaneous gradient, which is preferably measured at a Si melt portion located under the Si single crystal ingot IG.

The high quality Si single crystal ingot is preferably grown in conditions where the measured temperature gradient satisfies Equation 1 below:

$$(\Delta T\max - \Delta T\min)/\Delta T\min \times 100 \leq 10 \qquad \text{Equation 1,}$$

where $\Delta T\max$ is maximum temperature gradient measured, and $\Delta T\min$ is minimum temperature gradient measured (refer to Korean Patent Application Publication No. 2004-98530).

Referring to FIG. 2 which illustrates the temperature gradient profile of Si melt measured along an axis in parallel with the longitudinal direction of a single crystal ingot, the present invention provides a hot region (designated with $T_H$ in FIG. 1) in Si melt that is relatively hotter than the surrounding region, and especially controls the temperature gradient in a region ranging from above to under the hot region $T_H$.

When measuring the temperature of Si melt SM along the axis X in parallel with the longitudinal direction of the Si single crystal ingot IG, the temperature of Si melt SM, starting from the solid-liquid interface, rises gradually up to the peak or hottest point H in proportion to the distance from the ingot IG, but starting from the hottest point H, descends gradually to the bottom of Si melt SM which is farthest from the ingot IG.

In this case, the Si single crystal ingot IG is grown preferably by maintaining a condition $\Delta Ti > \Delta Td$, in which $\Delta Ti$ is the temperature gradient of Si melt rising from the solid-liquid interface up to the hottest point H, and $\Delta Td$ is the temperature gradient of Si melt descending from the hottest point H to the melt bottom. The axis X acting as a reference of indicating temperature measurement position is preferably a central axis passing through the center of the Si single crystal ingot IG.

The hottest point H preferably exists at a position of about 1/5 to 2/3 of the total depth of Si melt SM, measured from the head (see Korean Patent Application No. 2004-0098530).

By improving the heater as above, the present invention can optimize the temperature distribution of Si melt along the radial and longitudinal directions of the single crystal ingot owing to the so-called "channel effect." As a result, it is possible to easily produce high quality single crystal free of crystal defects with enhanced growth rate.

Furthermore, the Si single crystal ingot grown through the promoted melt convection of the invention has quality distribution substantially asymmetric about the central axis thereof. This results from the fact that activated melt convection under crystal growth interface causes asymmetric convection distribution, resulting in substantially asymmetric crystal growth condition along the central axis. However, this does not cause any problem in ensuring a high quality single crystal ingot and wafer. That is, in the Si wafer of the invention, an interstitial dominant region is substantially asymmetric to a vacancy dominant region.

Pulling means (not shown) is installed above the chamber 10 to pull a cable, and a seed crystal is provided at the bottom tip of the cable in contact with Si melt SM inside the quartz crucible 20 so that a Si single crystal ingot IG is grown in response to pulling of the cable and elevation of the seed crystal. The pulling means carries out rotation while pulling the cable during the growth of the Si single crystal ingot IG, in which the Si single crystal ingot IG is raised while being rotated coaxially with the rotary shaft 30 of the crucible 20, but in the reverse direction.

Inert gas such as Ar, Ne and N is supplied to the growing single crystal ingot IG and Si melt SM via a top portion of the chamber 10, and used inert gas is exhausted out via a lower portion of the chamber 10.

A heat shield 50 is installed between the Si single crystal ingot IG and the crucible 20 to surround the ingot IG in order to prevent heat dissipation from the ingot IG. A cylindrical heat cover 60 is also attached to the heat shield 50 at a portion most adjacent to the Si single crystal ingot IG in order to further shield heat flow thereby keeping the heat.

Furthermore, a magnet 70 is installed to surround the outer circumference of the barrel-shaped thermostat or heat insulator 45 and the heater 40 is used as stable heat source in order to prevent supercooling of Si melt. Preferably, this can also control heat to be transferred to the solid-liquid interface via various paths from the heater 40 by adjusting the intensity of a magnetic field by the magnet 70. As a result, a more efficient heat transfer can be achieved.

The magnetic field can be induced vertically or horizontally in the longitudinal direction of the single crystal ingot, or a CUSP magnetic field may also be induced. When magnetic lines are made into specific shapes in the solid-liquid interface and Si melt thereunder, the same effects are obtained.

However, it is more preferable to induce the CUSP magnetic field ununiformly so that the temperature around the bottom of the quartz crucible becomes relatively lower. This can minimize oxygen dissolution from the crucible bottom or migration of dissolved oxygen (see Korean Patent Application No. 2005-0068097).

Since deceleration of the rotation speed of the crucible reduces the temperature difference of Si melt in the radial direction causing the temperature distribution to be uniform, the rotation speed of the crucible should be dropped as slow as possible in order to control the temperature of Si melt in the radial direction of single crystal (see Korean Patent Application No. 2004-0098530).

Furthermore, the operation range of the rotation speed of the single crystal ingot IG should be determined while taking into consideration the rotation speed of the crucible 20 in order to produce high quality single crystal with high productivity.

If the Si single crystal ingot rotates too fast, compared to slow rotation of the crucible, cold Si melt rises up from the crucible bottom. This as a result lowers the temperature of a hot region, and thus drops the vertical temperature gradient of Si melt.

So, it is preferable that the Si single crystal ingot is grown according to conditions satisfying Equation 2 below:

$$3 \leq Ln[Vs/Vc] \leq 5 \quad \text{Equation 2,}$$

where Vc is the rotation speed of the crucible, and Vs is the rotation speed of the Si single crystal ingot.

The process for growing a Si single crystal ingot of the invention can control point defects such as vacancy and interstitial, thereby restraining all of faults such as growth faults or dislocations (e.g. edge, screw and loop dislocations), stacking faults and voids (e.g. gathered vacancies).

Recent development in Si wafer fabrication technology allows realization of defect-free wafers, which are free of point defects or aggregation defects as described above. Even though concentration is not high to such a degree that aggregation may take place, relatively high concentration of vacancy and oxygen can create secondary defect such as micro precipitate in vicinity of an active device region during heat treatment of an actual fabrication process of semiconductor devices.

However, the afore-described apparatus and method according to the embodiment of the invention can sufficiently lower vacancy concentration in a Si single crystal ingot grown thereby so that defects, such as micro precipitates, are not formed in the vicinity of an active device region. That is, this invention can enable high productivity wafers having point defects at a suitable level of concentration lower than the critical saturation concentration of vacancies that can form into micro precipitates during heat treatment. In this case, heat treatment conditions and results are reported from Korean Patent Application No. 2004-0098530.

Following effects are obtained from the present invention as described above.

First, with the heater having localized heat output, it is possible to increase the rising temperature gradient of melt or the temperature difference between the solid-liquid interface and the hot region $T_H$, thereby enhancing the growth rate of a high quality Si single crystal ingot.

Accordingly, the high growth rate can raise the yield of high quality Si single crystal ingots.

Furthermore, by changing localized heat output positions, it is possible to adjust the degree of oxygen dissolution from the rounded portion of the crucible bottom and the migration of dissolved oxygen, thereby growing high quality Si single crystal ingots with various oxygen specifications.

Besides, by using the apparatus for growing a Si single crystal ingot, it is possible to provide a high quality Si single crystal ingot and wafer having a low point defect concentration at such a degree that does not cause secondary defect such as micro precipitate in vicinity of an active device region by heat treatment in device fabrication process.

Moreover, by using a wafer machined from the high quality Si single crystal ingot, it is possible to enhance the yield of electronic devices.

Although the preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for growing a silicon single crystal by the Czochralski method, the method comprising:

providing a heater installed aside a crucible containing silicon melt, the heater having a narrow cross section or a high resistance in a middle region as a localized heating position; and adjusting the heater, by changing the localized heating position, so as to supply a maximum heat output to a portion adjacent to a central plane between the bottom face of the crucible and a solid-liquid interface, and to configure a temperature distribution of the silicon melt such that when a temperature of the crucible is measured along an axis in parallel with a longitudinal direction of a single crystal ingot, the temperature of the crucible, from a hottest point, gradually descends toward the bottom face of the crucible and the solid-liquid interface since convection to the hot zone is promoted, thus controlling a quantity of oxygen dissolution from the crucible.

2. The method according to claim 1, wherein the heater is adapted to minimize the oxygen dissolution in the crucible and promote a melt convection along an imaginary channel from a hottest region to a hot region of the silicon melt in order to realize a heat transfer with a minimized heat loss.

3. The method according to claim 2, wherein the silicon single crystal ingot is grown with an asymmetric quality distribution about a central axis by the promoted melt convection.

4. The method according to claim 1, wherein the heater is adapted to grow the silicon single crystal ingot according to conditions that a rising temperature gradient of the silicon melt is larger than a descending temperature gradient of the silicon melt.

5. The method according to claim 4, wherein the temperature gradient is an instantaneous temperature gradient in vertical direction of the silicon melt.

* * * * *